(12) United States Patent
Hasegawa et al.

(10) Patent No.: US 6,423,934 B2
(45) Date of Patent: Jul. 23, 2002

(54) METHOD FOR FORMING THROUGH HOLES

(75) Inventors: Toshinori Hasegawa; Shin Ishimatsu; Jun Koide, all of Yokohama (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/315,019

(22) Filed: May 20, 1999

(30) Foreign Application Priority Data

May 20, 1998 (JP) .......................................... 10-138653
Jun. 15, 1998 (JP) .......................................... 10-166899
May 17, 1999 (JP) .......................................... 11-135658

(51) Int. Cl.$^7$ ............................................. B23K 26/00
(52) U.S. Cl. .............................. 219/121.71; 219/121.7; 219/121.69; 219/121.73; 219/121.68; 29/890.1
(58) Field of Search ........................ 219/121.71, 121.7, 219/121.69, 121.85, 121.73, 121.68; 29/890.1

(56) References Cited

U.S. PATENT DOCUMENTS

| 5,189,437 A | * 2/1993 | Michaelis et al. ............ 346/1.1 |
| 5,263,250 A | 11/1993 | Nishiwaki et al. ......... 29/890.1 |
| 5,517,000 A | 5/1996 | Nishiwaki et al. ...... 219/121.77 |
| 5,703,631 A | * 12/1997 | Hayes et al. .................... 347/47 |
| 5,808,641 A | 9/1998 | Miyagawa et al. ............ 347/65 |
| 5,811,019 A | * 9/1998 | Nakayama et al. ............ 216/27 |
| 5,940,957 A | 8/1999 | Goto et al. ...................... 29/611 |
| 5,948,290 A | * 9/1999 | Yamamoto et al. ..... 219/121.71 |
| 6,040,552 A | * 3/2000 | Jain et al. ................. 219/121.7 |
| 6,089,698 A | * 7/2000 | Temple et al. ................. 347/47 |

FOREIGN PATENT DOCUMENTS

| JP | 60-13449 | 1/1985 |
| JP | 61-48582 | 3/1986 |
| JP | 2-187346 | 7/1990 |

* cited by examiner

Primary Examiner—Patrick Ryan
Assistant Examiner—M. Alexandra Elve
(74) Attorney, Agent, or Firm—Fitzpatrick, Cella, Harper & Scinto (57) ABSTRACT

A method for forming through holes, which has laser beam as the light source to project the laser beam to the work object using an optical system through a photomask for the formation of through holes on the work object by ablation processing, comprises the steps of increasing the concentration of the optical processing energy contributing to the process using the reflected beam created from the work object in the laser ablation processing; and forming each of through holes having the configuration enabling the narrower end to be changed to the wider end in the incident direction of laser beam. With the structure thus arranged, it becomes possible to increase the energy concentration that contributes to the process as compared with the usual ablation processing, because the reflected beam created in the ablation processing can be utilized again for the optical processing. Then, each of the through holes can be formed easily in the configuration in which the narrower end changes to the wider end in the incident direction of laser beam, which cannot be easily processed by the application of the usual ablation processing.

17 Claims, 9 Drawing Sheets

$y = \tan(90° - \Theta) \times (x - w)$ ·····(2)    $y = -\tan(90° - 2\Theta) \times x$ ·····(1)

METHOD FOR FORMING THROUGH HOLES

BACKGROUND OF THE INVENTION

1. Field of the Invention

The present invention relates to a method for forming through holes on a work piece by use of laser beam.

2. Related Background Art

Conventionally, as a method for forming through holes, the machining that uses a drill or the like has been mainly practiced. However, with a method of the kind, it is difficult to process a hole of a diameter as small as $\phi 100 \mu m$ or less, for example. Also, in recent years, along with the development of the high performance electronic equipment, it has been required to arrange its wiring in higher density. As a result, there is a need increasingly for processing fine holes at small pitches, such as a printed-circuit board which is a typical example of those requiring a larger amount of drilling operation.

As one of the processing methods to meet such requirement, there is a method for processing the sample locally by the coherent beam irradiated onto the work piece through the mask provided with openings which are partly arranged. For example, as disclosed in the specification of Japanese Patent Laid-Open Application No. 60-13449, when through holes are processed on a printed-circuit board where a metallic layer is bonded on the surface of an organic substrate, such as polyimide, polyester, glass epoxy, it is arranged that, at first the metallic layer on the surface is selectively etched into the pattern to be processed. Then, with this metallic layer as a mask, the coherent laser beam is irradiated onto the substrate to process the through holes. Also, as disclosed in the specification of Japanese Patent Laid-Open Application No. 61-48582, there is a fine processing method using the etching and the irradiation of the coherent laser beam in combination. In this method, photoresist film is formed by the same pattern in the same position on both faces of a work piece, and then, the etching process is suspended before the hole is penetrated. Then, after the resist film is removed, the total number or a given number of bridges thus formed are removed by use of the coherent laser beam that runs along the same locus as the photoresist pattern.

However, when a work piece is processed by use of the coherent laser beam by the application of this technique, there is a problem that only the hole whose leading end may become narrower can be formed, but no others. This is because the converged coherent laser beam is caused to irradiate the inclined faces due to the taper angle created when the laser process is executed. Then, conceivably, as compared with the energy concentration of the coherent laser beam irradiated to the flat surface, the energy of the irradiated coherent laser beam is attenuated in this event to be less than the limit of the energy concentration (the threshold value).

Since each of the through holes is configured to be narrower at its leading end (the so-called tapered configuration), the difference becomes greater between the diameter of the opening of the through hole on the side where the laser beam is incident upon (the entrance side), and that of the exit side inevitably.

For example, if the printed-circuit board is provided with conductive layers above and below the insulation layer, which are electrically connected themselves with each other through the conductive substance filled in the through hole formed on the insulation layer, it is preferable to make the area larger for each opening on the edges of the through hole. In this case, if the difference is great between the diameters of the openings on the edges of the through hole as described earlier, it may be difficult to secure the sufficient diameter of the opening on the exit side in some cases. If it should be attempted to secure the sufficient diameter of the opening on the exit side, the diameter of the opening on the entrance side should be made larger than actually needed. Thus, the structure becomes improper for the formation of the through holes which should be arranged in higher density.

Also, if through holes of the kind should be adopted for the discharge ports of an ink jet head, the thickness of the exit edge of each through hole (discharge port) becomes thinner locally depending on the taper angles. Then, there is a fear that the exit end of each through hole (discharge port) is chipped off due to the repeated cleaning by use of a blade or the like.

SUMMARY OF THE INVENTION

The present invention is designed in consideration of the technical problems discussed above. It is an object of the invention to provide a method for forming through holes which makes it easier to form each of them with a small difference between the opening diameters by the utilization of coherent laser beam that reflects from a work piece while in the laser ablation.

The inventors hereof have given attention to the reflected beam created from the work object in the ablation processing when the laser beam is projected to the work object through the photomask for the performance of the ablation processing in order to achieve the objectives of the present invention. Then, the method of the invention for forming through holes, which has laser beam as the light source to project the laser beam to the work object using an optical system through a photomask for the formation of through holes on the work object by ablation processing, comprises the steps of increasing the concentration of the optical processing energy contributing to the process using the reflected beam created from the work object in the laser ablation processing; and forming each of through holes having the configuration enabling the narrower end to be changed to the wider end in the incident direction of laser beam.

Also, the method of the invention for forming through holes is provided with laser beam as the light source to project the laser beam to the work object using an optical system through a photomask for the formation of through holes on the work object by ablation processing. For this method, it is arranged that the photomask comprises a light shielding portion to form the unexposed portion in the interior of the through hole formed on the work object, and a light transmitting portion surrounding the light shielding portion to form each of the through holes.

With the structure thus arranged, it becomes possible to increase the energy concentration that contributes to the process as compared with the usual ablation processing, because the reflected beam created in the ablation processing can be utilized again for the optical processing. As a result, each of the through holes can be formed easily in the configuration in which the narrower end changes to the wider end in the incident direction of laser beam, which cannot be easily processed by the application of the usual ablation processing. Then, in accordance with the method of the present invention, the difference is made smaller between the opening diameters, hence making it possible to apply the method preferably for the formation of through holes which are arranged in higher density. Also, the section of the edge portion formed inner side of the end portion of the through hole does not present any acute angle for the through holes of the minimum diameter. As a result, if the through holes thus formed are applied to the discharge ports of an ink jet head described earlier, it becomes possible to reduce the chip off of the edge portion thereof significantly.

Further, with the structure of the photomask thus arranged, the amount of laser irradiation to the work piece becomes smaller than the conventional method. As a result, it becomes possible to significantly reduce the expansion of the work piece due to heat generated in the laser processing. Also, with the unprocessed portion that resides in the interior of each through hole, it is possible to form each of the through holes having a lesser amount of flash.

DETAILED DESCRIPTION OF THE PREFERRED EMBODIMENTS

Hereinafter, with reference to the accompanying drawings, the present invention will be described.

First Embodiment

At first, preceding to the description of the present invention, the conventional method of the optical processing will be described in conjunction with the accompanying drawings.

Figure 2:
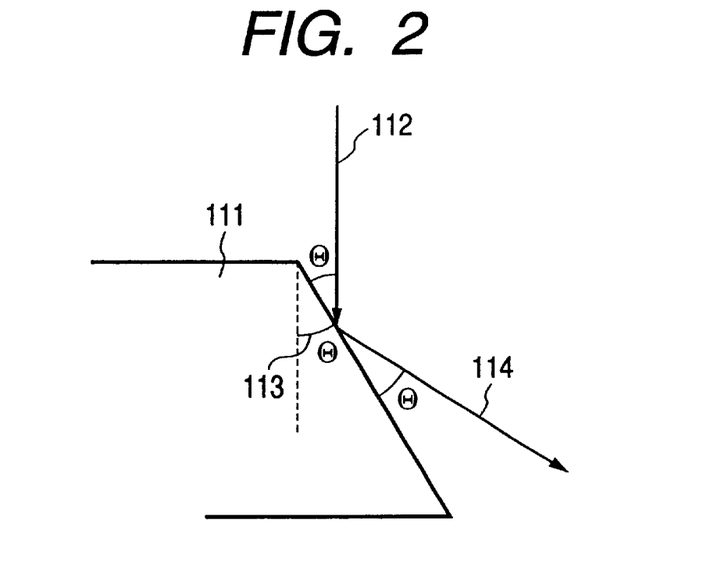
FIG. 2 is a view which illustrates the conventional optical processing method.

FIG. 2 is a view which illustrates the conventional method of the optical processing. In FIG. 2, a reference numeral 111 designates a work piece; 112, the coherent laser beam used for the optical processing; 113, the taper angle of the process; and 114, the reflected coherent laser beam 112 created by reflection due to the taper of the work piece 111.

When the laser ablation process is executed by the irradiation of the coherent laser beam 112 onto the work piece 111, the taper angle 113 is created at first on the outer contour of the portion (the processing shape) of the work piece upon which the laser is irradiated. Characteristically, this taper angle 113 is influenced by the energy of the irradiated coherent laser beam. The higher the irradiated energy, the smaller is the taper angle 113. The lower the energy of the irradiated coherent laser beam, the larger is the taper angle 113. Then, once a taper angle of the kind takes place, the coherent beam 112 is incident upon the processing surface of the work piece 111 diagonally. As a result, the laser beam 112 is reflected partly as at 114 in FIG. 2, making it impossible to secure the sufficient energy concentration of the laser beam in the direction of its incidence. The resultant process advances almost along the taper angle 113 thus initially formed, and the through hole having the narrower leading end is formed in the taper configuration eventually.

In contrast, for the present invention, attention is given to the beam reflected from the objective work piece while in process. Then, the through hole is formed by the utilization of this reflected beam so that its configuration changes from the narrower leading end to the wider one.

Figure 3:
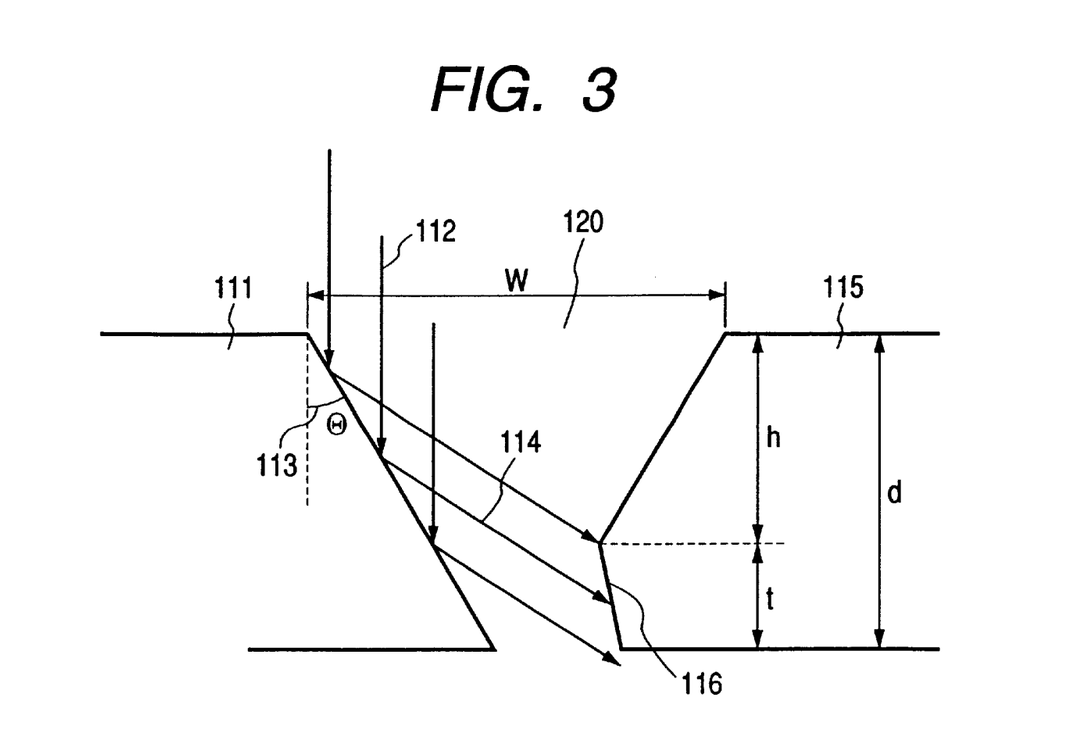
FIG. 3 is a view which illustrates the optical processing method that utilizes the reflected beam.

FIG. 3 is a view which illustrates the method for forming through holes in accordance with the present invention. In FIG. 3, a reference numeral 111 designates a work piece; 112, the coherent laser beam for use of the optical processing; 113, the taper angle of the process; 114, the reflected coherent laser beam created by the coherent laser beam 112 for use of the optical processing when it is reflected from the taper angle portion of the work piece 111.

In accordance with the present embodiment, it is arranged that the aspect ratio of the through hole becomes higher as compared with the conventional example described earlier (that is, the ratio of the depth d of the through hole is greater than the diameter w thereof), and that the reflected coherent laser beam, which has never contributed to the through hole processing conventionally, is again irradiated to the work piece.

In accordance with the present embodiment, too, the through hole 120 having the narrower leading end is being formed in the initial stage of the ablation process as in the conventional art. However, after the depth of the through hole almost exceeds the distance h, the laser beam 114 reflected from the processing surface of the work piece 111 begins to be irradiated onto the opposite side face 116 of the through hole 120. On this side face 116, the laser beam 112 is also irradiated from above the through hole. Therefore, the concentration of the laser energy on this portion becomes increased to make the diameter of the through hole gradually wider (widen toward the end) in processing.

Figure 5:
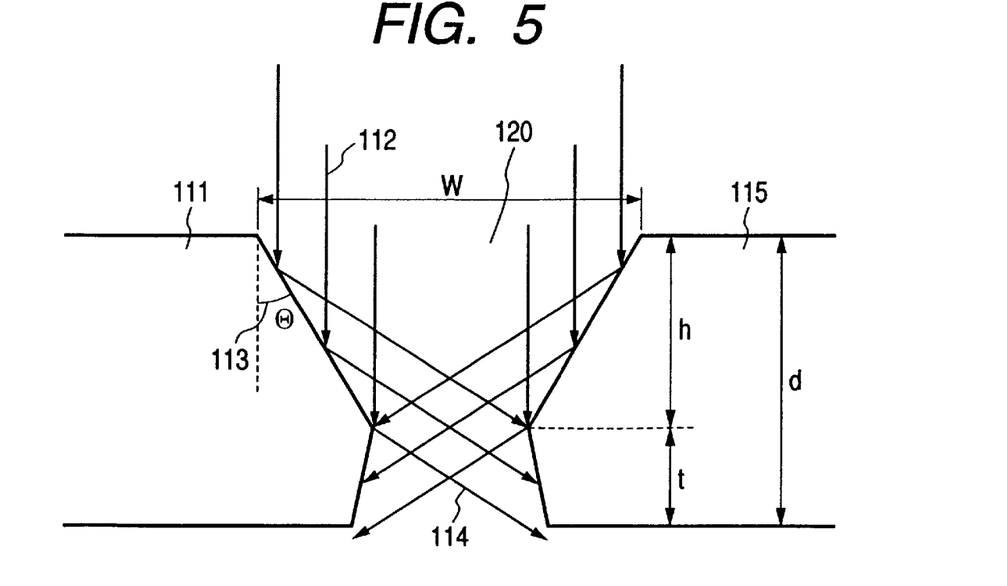
FIG. 5 is a view which illustrates the through hole formation processing by the utilization of the reflected beam created by the taper angles in accordance with one embodiment of the present invention.

In this respect, the side face on the opposite side of the through hole is processed in the same manner. Therefore, the actual configuration becomes as shown in FIG. 5 eventually.

Here, it is preferable to use the excimer laser beam as the laser beam used for the present invention.

Now, the distance h at which the reflected beam begins to be irradiated is determined almost by the diameter of the opening of the through hole on the incidence side of the laser beam (the diameter of the mask opening) w, and the taper angle $\Theta$ which is made in the initial stage of the laser processing. Hereunder, in conjunction with FIG. 4, the description will be made of the relationship between this distance h and the w and the $\Theta$.

Figure 4:
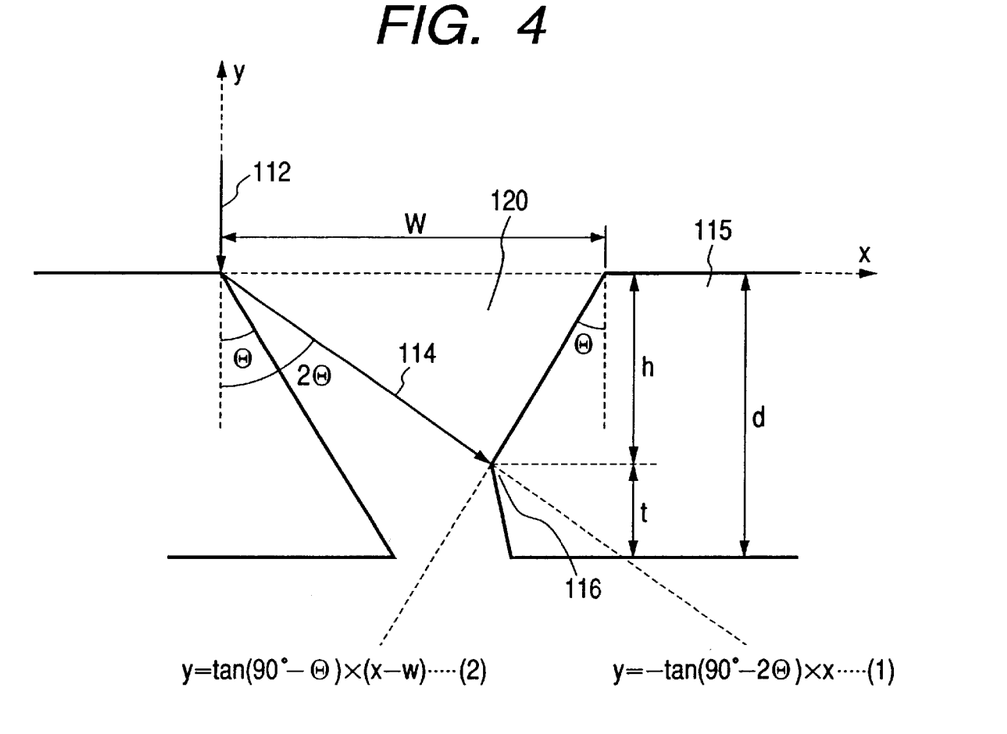
FIG. 4 is a view which shows the coordinate system defined for the geometrical illustration of the optical processing method that utilizes the reflected beam.

For the convenience of the description, it is defined in FIG. 4 to set 0 at the right-side end of the incident side of the through hole 120 for the two dimensional coordinate axis (X-Y). The coherent laser beam 112 irradiated for the ablation processing is reflected by the taper angle 113 in processing the work piece 111. The reflected beam 114 advances in the direction at an angel of −2Θ to the axis Y. Therefore, in the coordinate system in FIG. 4, this reflected beam is expressed by the linear equation as follows:

$$y = -x \cdot \tan(90° - 2\Theta) \quad (1)$$

Also, the taper, which is positioned at the distance w away from the intersection of the axes X and Y, and angled at Θ to the facing work piece 115, is expressed by the quadratic equation as follows:

$$y = (x - w) \cdot \tan(90° - \Theta) \quad (2)$$

From them, it is possible to obtain the coordinate of the position at 116 where the reflected beam 114 is again irradiated onto the processing surface of the facing work piece 115 as the intersecting point of the straight lines expressed by the equations (1) and (2).

Now, the distance h is expressed as follows by the function of the w and Θ:

$$h = w \cdot \tan(90° - \Theta) \cdot \tan(90° - 2\Theta) / \{\tan(90° - 2\Theta) + \tan(90° - \Theta)\} \quad (3)$$

Also, the reference mark t in FIG. 4 is:

$$t = d - h$$

from the relationship between the thickness d of the work piece 115 and the distance h. Therefore, by the application of the expression (3), it can be expressed as follows:

$$t = d - w \cdot \tan(90° - \Theta) \cdot \tan(90° - 2\Theta) / \{\tan(90° - 2\Theta) + \tan(90° - \Theta)\} \quad (4)$$

This value t indicates the inner location away from the bottom end (the exit side end of the through hole) of the work piece 115, in which the reflected beam 114 causes the taper angle to change.

In other words, if the t≧0, the reflected beam is again irradiated onto the facing work piece 115.

If the t<0, the reflected beam is not irradiated again to the facing work piece 115, and passes the work pieces.

Therefore, if the taper angle Θ 113 and the opening diameter w of the through hole should satisfy the condition of the t>0, it becomes possible to perform the optical processing utilizing the reflected beam 114.

Then, if the reflected beam can be utilized, it is possible to obtain the same effect as the one which may be obtainable by the increased luminance of the irradiation.

Also, with the structure described above, it is necessary to make the aspect ratio higher for the structure of the through hole, but when the present invention is applied to the through hole having the lower aspect ratio, it may be possible to obtain the desired depth of the through hole by the arrangement of the structure in which the work piece is cut in the thickness direction from the incident side of the laser beam subsequent to the laser irradiation step or by the arrangement of the structure in which the same kind of the material as the work piece is bonded in advance to the work piece on the incident side of the laser beam, and then, after laser irradiation step, this bonded material is peeled off.

In accordance with the present embodiment, the work piece is prepared by resin in a thickness of 0.1 mm, and at the same time, the laser power of the excimer laser is adjusted so as to make the taper angle Θ10° in processing. Then, using the mask having the patterns of different opening diameters the laser ablation process is performed on the work piece to form the through holes. Each configuration of the through holes is observed at that time, and the values h and t are also measured and shown in Table 1.

TABLE 1

| Thickness of resin (mm) | 0.1 | | | | | |
|---|---|---|---|---|---|---|
| Taper angle in the process Θ(°) | 10° | | | | | |
| w(mm) | 0.2 | 0.1 | 0.08 | 0.06 | 0.05 | 0.03 |
| h(mm) | 0.370 | 0.185 | 0.148 | 0.111 | 0.093 | 0.056 |
| t(mm) | −0.5934 | −0.1467 | −0.0574 | 0.0320 | 0.0766 | 0.1660 |

As shown in the table, there is no change in the taper angles of the through hole if the opening diameter is 0.08 mm or more thereof on the incident side of the laser beam. This is because the aforesaid t value becomes negative, and conceivably, the reflected beam created in the optical processing is not irradiated onto the facing work piece. On the other hand, if the gap in the work piece is less than 0.06 mm, the aforesaid value t should become positive. Here, in the actual through hole, there is also observed no portion where the taper angle changes due to the reflected beam.

Figure 1:
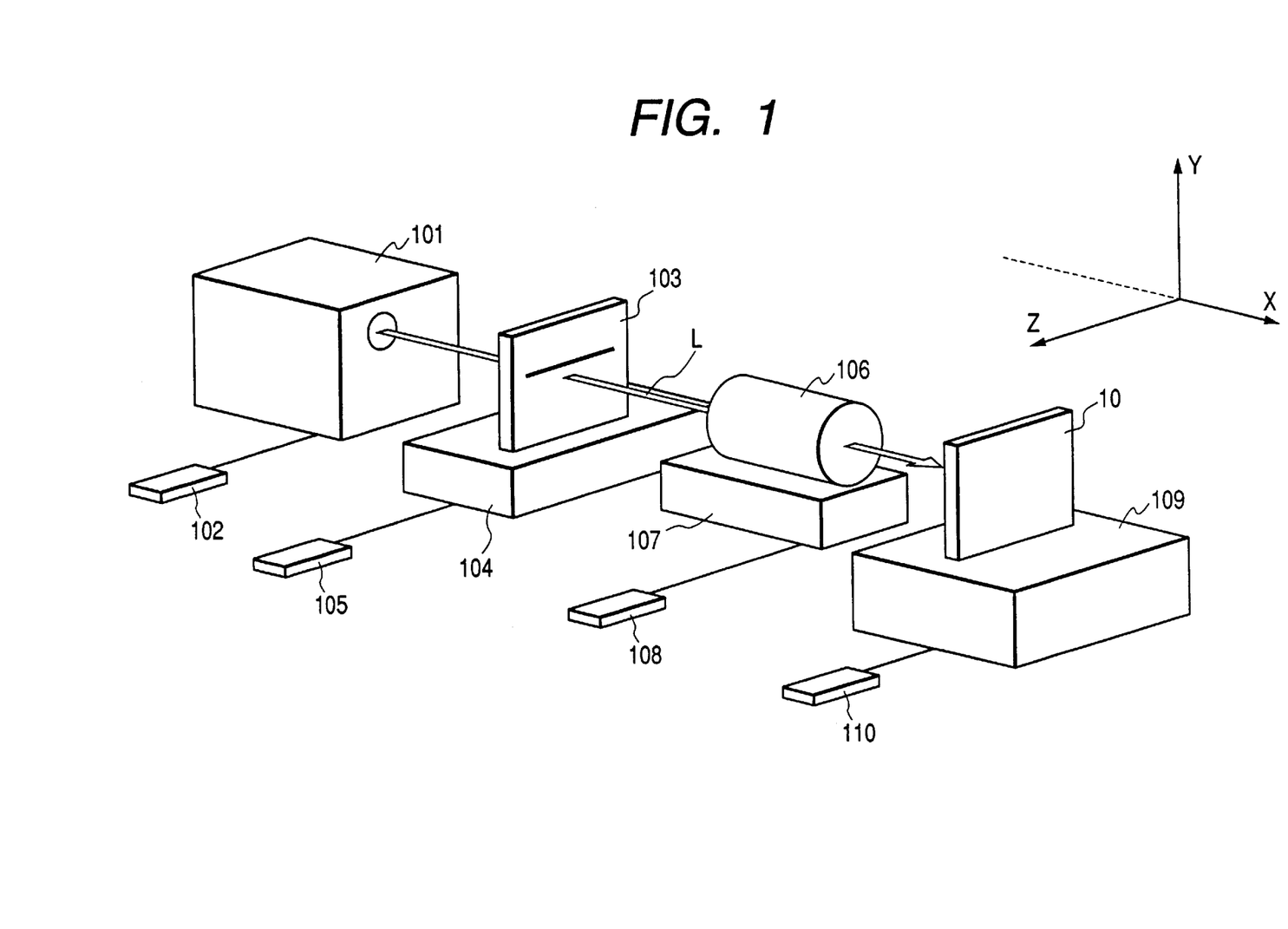
FIG. 1 is a view which illustrates one example of the optical processing apparatus using the present invention.

As shown in FIG. 1, the apparatus, which performs the ablation processing by the utilization of the aforesaid reflected beam, comprises the coherent beam oscillator 101 serving as the light source to generate the coherent beam L; the controller 102 that changes the oscillating voltages and the oscillation frequencies of the coherent beam irradiated from the oscillator; the mask 103 having the opening pattern of a desired processing configuration; the shift driving device 104 that moves the mask freely forward and backward in the axial direction of the coherent beam L and the controller 105 that controls this device; and the projection optical system 106 to project the opening pattern onto the blank 10, the rotary driving device 107 to rotate the projection optical system 106 around the optical axis of the coherent beam L, and the controller 108 that controls this device. The blank 10 is positioned by the movable stage 109 controlled by the controller 110 within the plane (Y and Z plane) perpendicular to the optical axis (axis X) of the coherent beam L.

The shift driving device 104 is provided with a driving mechanism using a motor (a stepping more or a servo motor, for example), and by use of the controller 105, the mask 103 is made movable in a precision of micron unit freely in the arbitrary directions, such as on the optical axis of the coherent beam L, the arrangement direction (along the axis Y in FIG. 4) of the opening pattern for use of the groove processing, the drilling, or both, or around the center of the optical axis of the coherent beam L. Also, as to the movement of the mask 103 itself, it is possible to select the continuous shift at a constant speed or the intermittent shifts.

Also, by use of a computer or the like, it may be possible to control the controllers 102, 105, 108, and 110 altogether to control the coherent beam oscillator 101 and each of the driving devices 104, 107, and 109.

(Second Embodiment)

One of the features of the structure in accordance with the present embodiment is the mask which is preferably usable for the laser processing that uses the aforesaid reflected beam.

Figure 6:
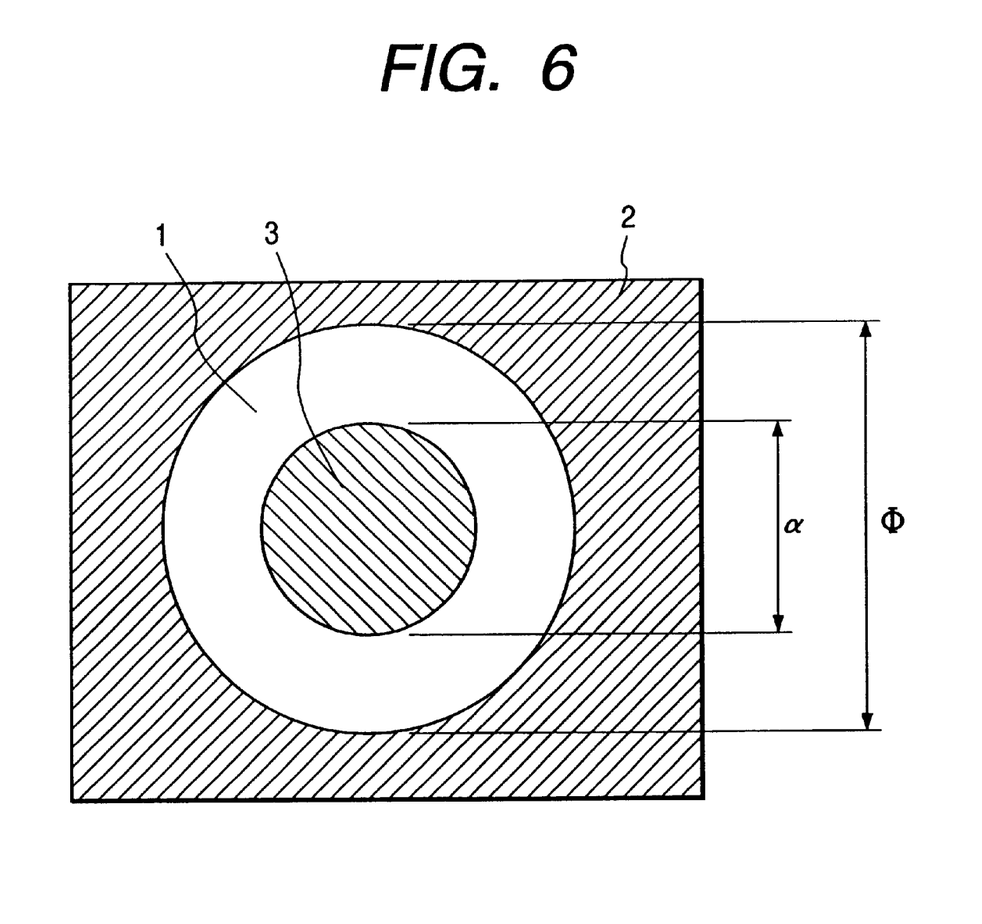
FIG. 6 is a schematic view which shows a mask in accordance with a second embodiment of the present invention.

FIG. 6 is a schematic view which shows the mask pattern of the present embodiment. In FIG. 6, a reference numeral 1 designates the mask. For this mask, the light transmitting portion 2 is provided to enable the laser to transmit it. The outer diameter of this light transmitting portion 2 determines the configuration of the through hole. In FIG. 6, a reference mark α designates the dimension of the frame portion, and φ, the outer diameter.

Inside the light transmitting portion 2, the light shielding portion 3 is arranged in such a manner to be framed by the light transmitting portion 2. When this mask pattern (hereinafter, the mask that has this mask pattern is referred to as the "framed mask") is used for the laser ablation processing, there remains on the work piece the portion yet to be processed in the through hole corresponding to the aforesaid light shielding portion 3. This unprocessed portion is separated from the work piece around it when the laser processing is performed on the light transmitting portion 2. Therefore, when the through hole is penetrated, this unprocessed portion is exhausted from the through hole by the application of the laser energy. As a result, the through hole is formed as in the case where the light shielding portion 3 is not provided for the interior of the light transmitting portion 2 of the conventional mask.

In accordance with the present invention, the laser energy is made smaller by the presence of the aforesaid unprocessed portion when it is irradiated to the work piece accordingly. Therefore, as compared with the conventional method, the expansion of the work piece is suppressed significantly, making it possible to perform a desired processing even when the through holes should be formed in higher density. Further, when the laser ablation process is performed, by-product adheres to the circumference of an opening. However, in accordance with the present invention, the amount of such adhesive particles is significantly reduced as compared with the conventional method. Particularly when the discharge ports of an ink jet head is processed by means of ablation, the adhesive particles of the kind may cause the direction of ink discharges to be twisted. Conventionally, therefore, it is necessary to arrange an extra step of removing such adhesive particles. With the structure of the present invention, this processing step of removing the adhesive particles is omitted or simplified.

Also, in accordance with the present invention, it becomes possible to reduce the flash that may be created in the through hole nearby the end portion of the laser beam exit side.

Now, the description will be made of the mechanism with which the flash of the through hole is reduced by means of the structure of the present invention.

Figure 7A:
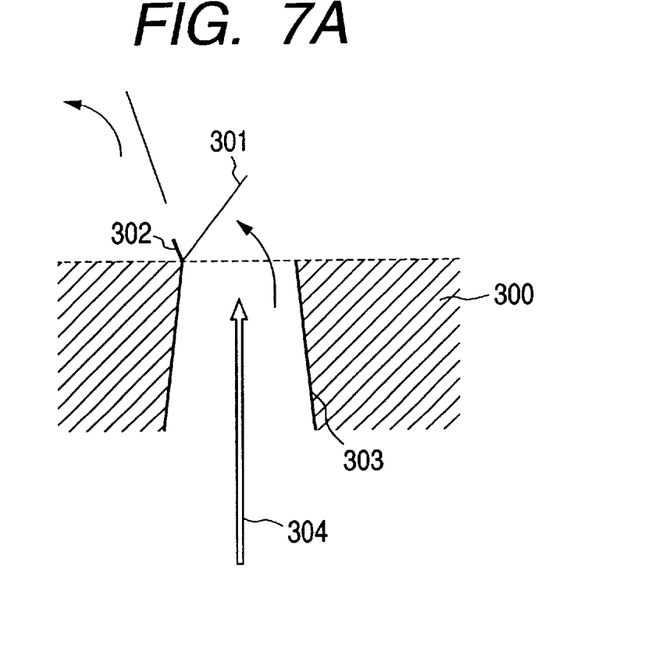
FIGS. 7A and 7B are views which illustrate the state of laser processing in accordance with the second embodiment and the conventional example.
Figure 7B:
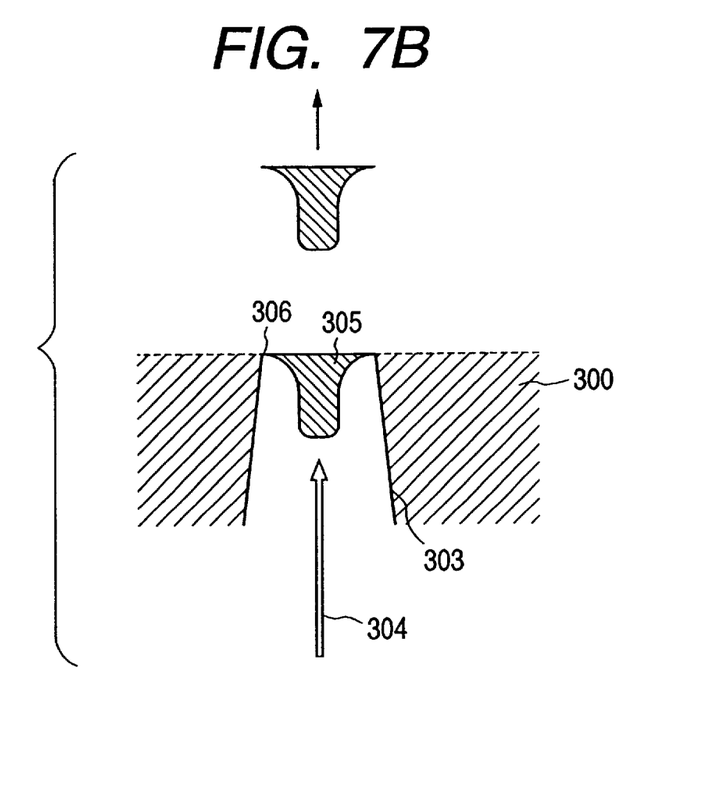

FIG. 7A is a view which illustrates the state of the conventional laser processing. FIG. 7B is a view which illustrates the state of the laser processing of the present invention.

In FIG. 7A, a reference numeral 300 designates a work piece; 303, a through hole; and 304, laser beam.

As the work piece 300 is being processed by laser ablation, a structure is formed as if a sheet cover 301 is arranged on the surface of the work piece immediately before the through hole is penetrated.

Then, the laser beam 304 is further irradiated from this state to process this cover 301 more, thus penetrating the through hole 303. Here, if the laser beam 304 is able to process the interior of the through hole 303 at a uniform velocity, the cover 301 is caused to fly out straightly in the processing direction. If the processing velocity of the laser beam 304 is varied in the interior of the through hole 303, the portion where the processing velocity is slower becomes a hinge 302. As a result, the cover 301 moves as if opening a door. Then, by the shock exerted by this movement of the cover 301, the hinged portion 302 is cut off. Then, the flash is created on this portion.

In contrast, the structure arranged by the present invention makes it possible to keep the unprocessed portion 305 still remaining on the cover portion immediately before the through hole is penetrated as shown in FIG. 7B. As compared with the cover, the volume of this unprocessed portion 305 is far greater. Consequently, the unprocessed portion 305 is not allowed to fly out until its connecting portion 306 is completely removed by the laser beam 304 even if the processing velocity of the laser beam 304 is varied in the interior of the through hole 303. As a result, the unprocessed portion 305 is not hinged to make it difficult to create any flash on that portion.

In this respect, if the discharge ports of an ink jet head are formed by the method described earlier, there have been created conventionally fine flashes partly on the exit edges of through holes (discharge ports), and there is a fear that depending on the configurations of the flash, the direction of ink discharges is subjected to being twisted eventually. With the structure described above, the flashes are not easily created. Then, the ink jet heads having excellent ink discharge direction are manufactured in a better production yield.

In accordance with the present embodiment, 140 through holes are formed on a work piece by the irradiation of excimer laser with the laser power of 750 mj/cm$^2$·pulse on a polysulfone material of 60 μm thick by use of the mask which may produce the opening diameter (incident side) of each through hole to be 40 μm, the diameter of each unprocessed portion to be 20 μm, and the arrangement density of the through holes to be 600 dpi. Also, as a comparative example, the through holes are formed in the same condition, but by use of a mask having the same opening diameter of each through hole without light shielding portions: with the result that whereas all the through holes formed by the method of the present invention for forming through holes are smooth in its configuration of the exit side of the laser beam, some of the through holes of the comparative example present flash, and by-product is caused to adhere in a large amount. Also, the work piece of 12 mm wide is used: with the result that whereas the work piece processed by the present embodiment presents the expansion of 2 μm in its width direction, the comparative example presents the expansion of approximately 6 μm. Thus, in accordance with the present invention, not only the through holes are formed uniformly in its configuration, but also, the expansion of the work piece can be suppressed significantly.

Now, the description will be made of the structure using the framed mask described earlier, which is applied to the technique to change the taper angles in the optical processing that utilizes the reflected beam.

Figure 8:
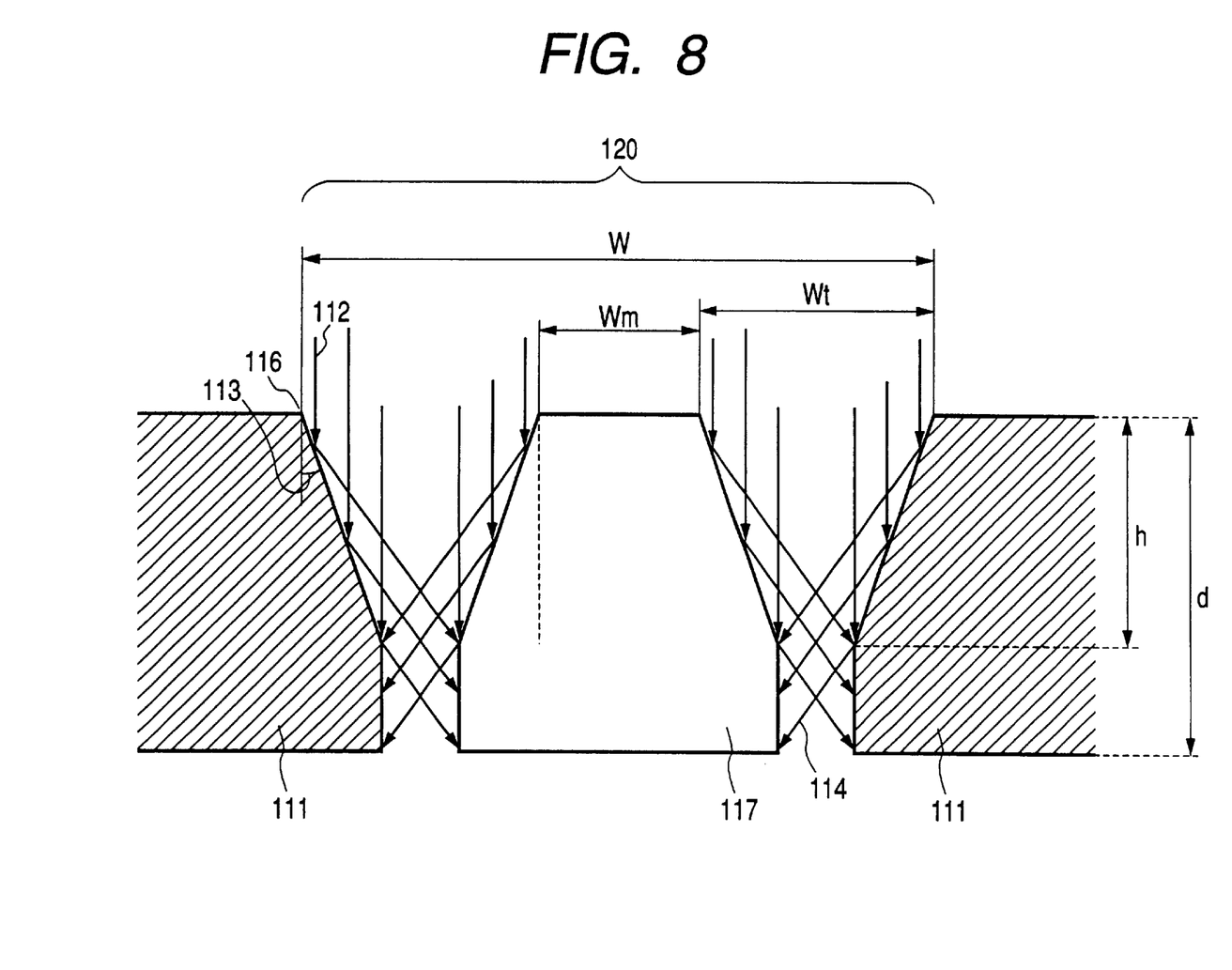
FIG. 8 is a view which illustrates the optical processing method that utilizes the reflected beam in accordance with the second embodiment.

Hereinafter, in conjunction with FIG. 8, the description will be made of a method for creating the reflected beam to change the taper angles of a work piece by the utilization of the aforesaid reflected beam. In FIG. 8, a reference numeral 111 designates a work piece; 112, the coherent laser beam for use of the optical processing; 114, the reflected coherent beam created when the coherent beam 112 for use of the optical processing is reflected from the taper angled portion of the work piece 111; 117, the unprocessed portion where no coherent beam is irradiated on the work piece 111; 120, a through hole; W, the outer dimension of the configuration formed on the work piece 111 by the application of the optical process. This reference mark W corresponds to the diameter of the light transmitting portion described earlier. Also, a reference mark Wm designates the width of the unprocessed portion 117 on the side of the work piece where the beam is irradiated. This Wm corresponds to the diameter of the light shielding portion described earlier. A reference mark Wt designates the distance between the unprocessed portion 117 and the work piece 111 on the incident side of the laser beam.

When the ablation processing is performed by irradiating the coherent laser beam 112 onto the work piece 111, the taper angle 113 appears at first on the outer contour of the portion of the work piece where the laser is irradiated (the processed configuration). This tape angle 113 is influenced by the energy of the coherent laser beam 112 thus irradiated. It has the characteristics that the higher the irradiated energy, the smaller is the taper angle 113, and the lower the energy of the irradiated coherent laser beam 112, the larger becomes the taper angle 113. Then, once such taper angle takes place, the coherent laser beam 112 is incident upon the processing surface of the work piece 111 diagonally. As a result, the laser beam 112 is partly reflected at 114 in FIG. 8 to make it impossible to secure the sufficient energy concentration in the incident direction of the laser beam 112, and the processing advances almost along the taper angle 113 which is initially formed.

After that, when the depth of the through hole 120 exceeds the distance h, the laser beam 114 reflected from the processing surface of the work piece 111 begins to be irradiated onto the unprocessed portion 117. Likewise, the laser beam reflected from the processing surface of the unprocessed portion 117 begins to be irradiated onto the opposite side face 116 of the through hole 120. On these portions, the laser beam 112 is also irradiated from above through hole. Therefore, the concentration of the laser energy is increased, thus processing the diameter of the through hole to be gradually wider (widen toward the end).

Now, if it is intended to utilize the reflected beam for the laser processing by use of the usual mask, there is a need for making the aspect ratio of the through hole higher (that is, the ratio of the depth d of a through hole is greater than the diameter w thereof). In contrast, by the structure of the present embodiment, the reflected beam takes place from the processing surface of the unprocessed portion in addition to the one from the processing surface of the through hole. Therefore, there is no need for making the aspect ratio higher as compared with the case where the reflected beam is utilized for the laser processing by use of the usual mask.

Now, the examination is made on the condition that may allow the utilization of the reflected beam when the framed mask is used.

Each of the reflected beam 114 of the coherent beams 112 irradiated onto the work piece 111 and the unprocessed portion 117 is positioned away from each other by the distance Wt, and it is shown that the reflected beam is again irradiated to the point 116 on the taper angle of the facing work piece 111 having the thickness of d. The position where the reflected beam is again irradiated begins with the position at the distance h from the upper end of the work piece 111. Now, in conjunction with FIG. 9, the description will be made of the expression of the distance h in terms of the function of the Wt and the $\Theta$.

Figure 9:
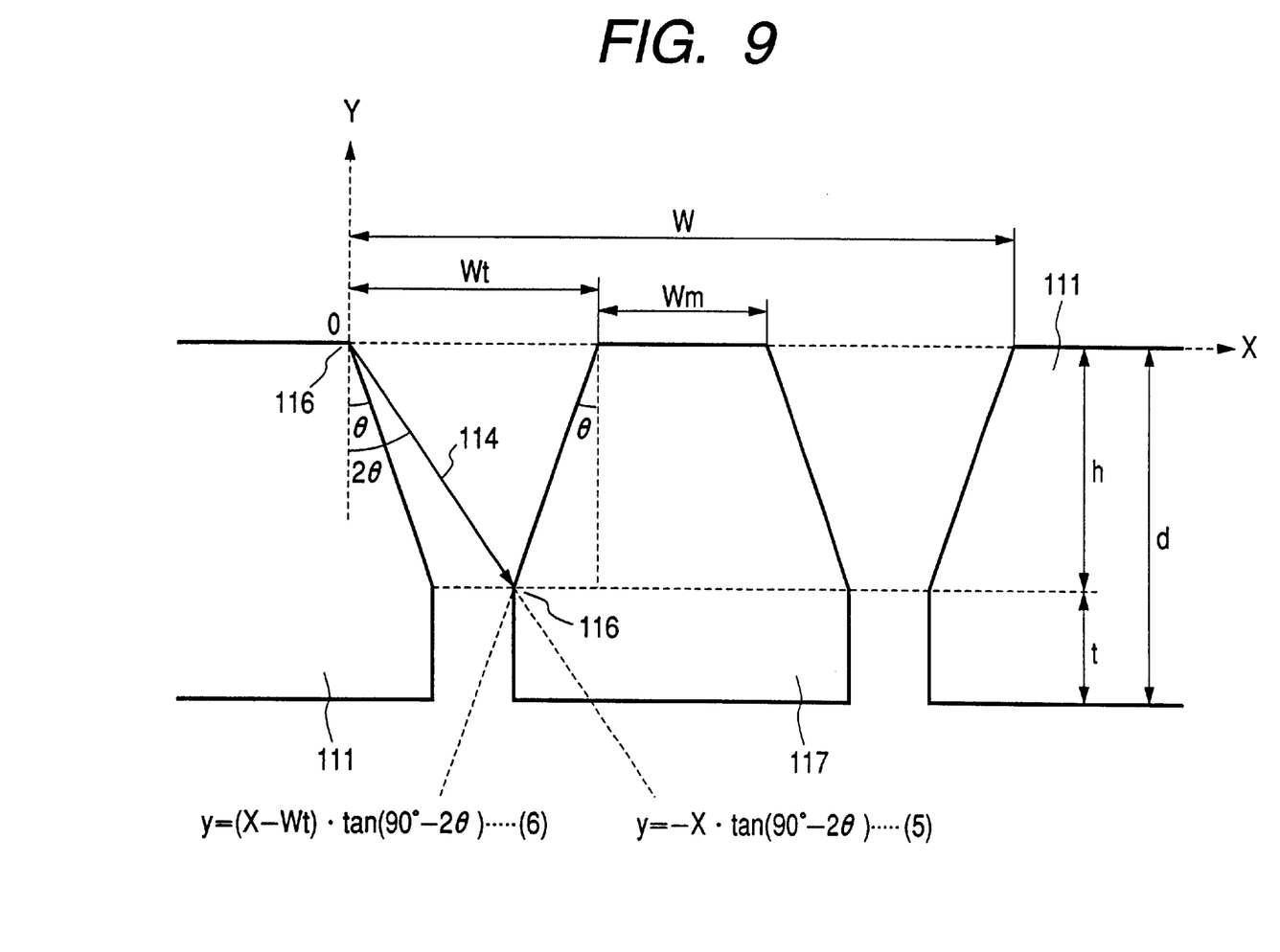
FIG. 9 is a view which shows the coordinate system defined for the geometrical illustration of the optical processing method that utilizes the reflected beam in accordance with the second embodiment.

For the convenience of the description, the axis of the two-dimensional coordinate(X-Y) is defined as shown in FIG. 9. Here, the intersecting point of the axis X and the axis Y is set at the upper end portion of the through hole on the left-hand side in FIG. 9.

The coherent beam irradiated for performing the ablation processing is reflected on the taper angled portion $\Theta$ of the work piece, and the reflected beam 114 advances in the direction at the angle $2\Theta$. Therefore, in the coordinate system in FIG. 9, this reflected beam is expressed as follows:

$$y = -x \cdot \tan(90° - 2\Theta) \qquad (5)$$

Also, being positioned away by the distance Wt, the taper angled portion having the angle $\Theta$ of the facing unprocessed portion 117 is expressed in the coordinate system in FIG. 9 as follows:

$$y = (x - Wt) \cdot \tan(90° - 2\Theta) \qquad (6)$$

From them, the coordinate of the position 116 where the reflected beam 114 is reflected at the taper angled portion of the facing unprocessed portion 117 is obtainable as the intersecting portion of the straight lines shown by the expressions (5) and (6).

Now, the absolute amount h is expressed by the following function of the Wt and the $\Theta$:

$$h = (Wt/2) \cdot \tan(90° - 2\Theta) \qquad (7)$$

Therefore, when the depth (the thickness of the work piece) d of the through hole is grater than the h, the reflected beam is again irradiated. Then, the condition that may allow the reflected beam to be irradiated is as follows:

$$d > (Wt/2) \cdot \tan(90° - 2\Theta) \qquad (8)$$

However, since the Wt is defined as the dimension of the work piece, the distance WT between the light transmitting portion and the light shielding portion on the actual mask is considered to be:

$$d > (K \cdot WT/2) \cdot \tan(90° - 2\Theta) \qquad (9)$$

where the contraction coefficient of the optical system is given as K. Therefore, it becomes possible to perform the optical processing by the utilization of the reflected beam 114 if the distance WT between the light transmitting portion and the light shielding portion satisfies the aforesaid condition.

Also, as to the taper angle $\Theta$, it changes depending on the laser powers as described earlier. Usually, however, its range is within 3° to 20°. As a result, if the $\Theta=3°$, it may become possible to utilize the reflected beam in most cases if the following relationship is satisfied:

$$d > (K \cdot WT/2) \cdot \tan(90° - 2 \cdot 3°) = 4.76 \cdot K \cdot WT \qquad (10)$$

Therefore, it is clear that in accordance with the present embodiment, if only the dimension of the distance WT between the light transmitting portion and the light shielding portion on the mask, and the thickness d of the work piece can satisfy the expression (6), the taper angle is made smaller by use of the coherent beam reflected from the taper angled portion of the facing work piece.

Also, if the size of the unprocessed portion is made smaller than the resolution of the irradiating coherent beam, the unprocessed portion is eliminated as the processing advances to obtain the desired configuration.

With the structure arranged as described above, the taper angles are made changeable by use of the reflected beam even if the through hole is not configured with a higher aspect. It is also found that this structure may produce an unexpected effect. In other words, the area of the open hole is not easily affected by the laser power when the laser ablation process is performed by the utilization of the reflected beam while using the aforesaid mask.

Hereinafter, in conjunction with FIGS. 10A and 10B, this ablation process will be described specifically.

Figure 10A:
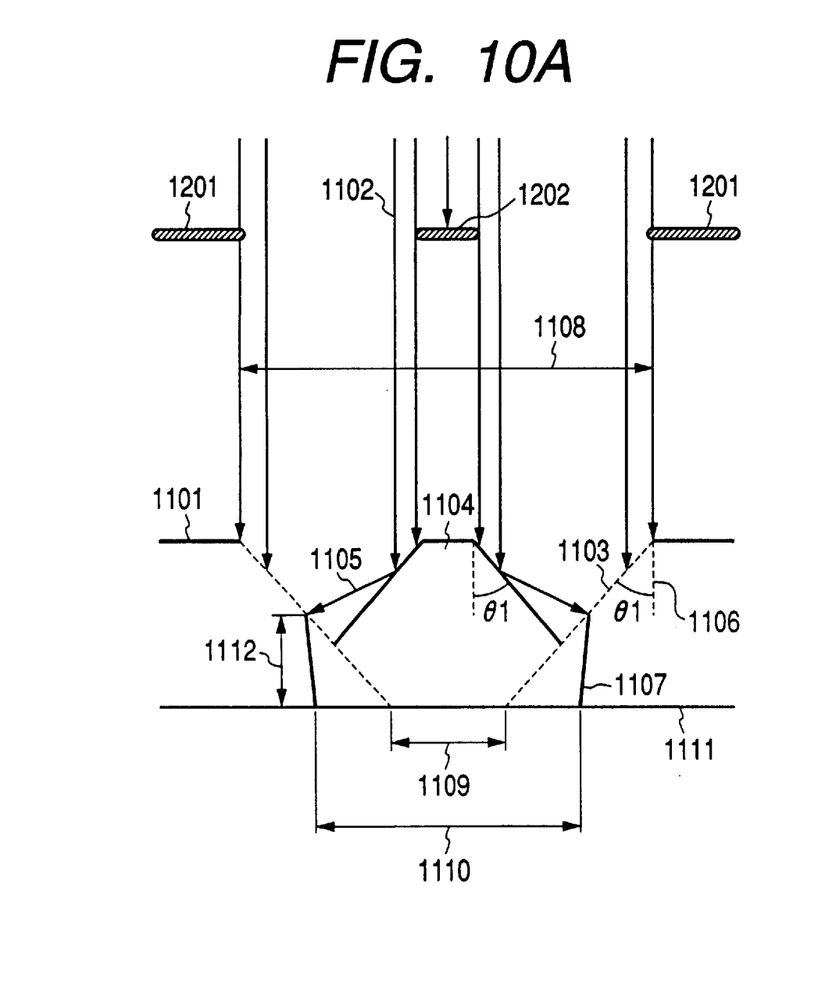
FIGS. 10A and 10B are views which illustrate the difference in the processed configurations of the through hole depending on the laser powers.
Figure 10B:
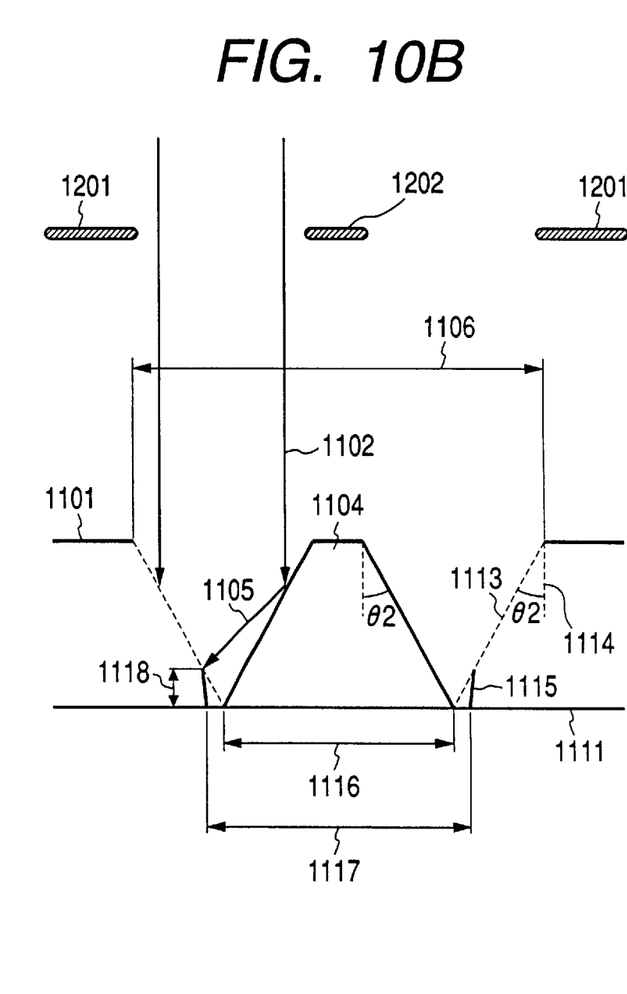

When the usual mask is used for processing, the taper portions (at 1103 in the lower powered processing and at 1113 in the higher powered processing) are formed as indicated by the broken lines in FIGS. 10A and 10B, having the taper angles in proportion to the processing powers (at 1106 in the lower powered processing and at 1114 in the higher powered processing).

In this case, if the framed mask 1201 is used, an unprocessed portion is formed on the central part corresponding to the light shielding portion 1202 on the framed mask. On the unprocessed portion, the tapered portion (at 1103 in the lower powered processing and at 1113 in the higher powered processing) as indicated by the broken lines in FIGS. 10A and 10B having the taper angles in proportion to the processing powers (at 1106 in the lower powered processing and at 1114 in the higher powered processing).

When the processing energy is low, the taper angle Θ1 1106 which is obtainable in the usual processing is great as shown in FIG. 10A. At this juncture, the taper angle formed by use of the framed mask 1201 on the unprocessed portion 1104 in the interior of the processed configuration is also equal to the angle Θ1 at 1106. Since this angle Θ1 at 1106 is great, the laser beam 1105 reflected from the unprocessed portion 1104 is again irradiated above the facing taper angle 1103 (the portion indicated by broken line) in the process. The laser beam 1105 is also irradiated from above again to increase the energy of the laser irradiation on that portion. Hence, the taper angle becomes smaller (indicated by solid lines) in the process.

When the processing energy is high, the taper angle Θ2 1114 which is obtainable in the usual processing is small as shown in FIG. 10B. At this juncture, the taper angle formed by use of the framed mask 1201 on the unprocessed portion 1104 in the interior of the processed configuration is also equal to the angle Θ2 at 1114. Since this angle Θ2 at 1114 is small, the laser beam 1105 reflected from the unprocessed portion 1104 is again irradiated below the facing taper angle 1113 (the portion indicated by broken line) in the process. The laser beam 1105 is irradiated again to increase the energy of the laser irradiation on that portion. As a result, the taper angle is scarcely made smaller (indicated by solid lines) in the process. Therefore, the smaller taper angle Θ2 at 1114, which is created fundamentally by the higher energy processing, becomes dominant so as to implement the processing of the discharge ports each having larger opening area.

Here, in accordance with the present embodiment, it is possible to absorb the influences exerted by the changes in the laser powers for the reasons described above. Thus, the variation of the opening areas of the through holes can be reduced significantly.

The inventors hereof have conducted the following experiments in order to confirm the effects of the present invention.

At first, polysulfone resin of 60 μm thick is prepared as the work piece. Then, with the contraction optical system, the diameter of the light transmitting portion of the mask is defined so that the opening area of the through hole on the incident side becomes 1,385 μm. Subsequently, by changing the size of the light shielding portion arranged in the interior of the light transmitting portion, the examination is made on the changing condition of the opening area of the through hole on the exit side.

In this respect, as to the laser powers, two kinds are adopted, that is, 652 mj/cm$^2$·pulse at the time of higher power, and 895 mj/cm$^2$·pulse at the time of lower power. The results are shown in Table 2. Here, in the table, the size of the light shielding portion is indicated by its ration to the light transmitting portion (hereinafter, this ratio is referred to as the frame rate and defined as the frame rate=the outer diameter of the light transmitting portion/the outer diameter of the light shielding porion (%)).

From the Table 2 it is understandable that the higher the frame rate, the greater becomes the opening area of the through hole on the exit side, and at the same time, the changes of the opening area become smaller against the laser powers. However, it becomes impossible to process the one having the frame rate of 90% or more, because the shielding ratio becomes too high. Also, it is clear from the graph that the effect of the frame becomes conspicuous when the frame rate is approximately 30% or more. It is, therefore, preferable to set the frame rate of the mask at 30 to 80%.

TABLE 2

| Frame rate (%) | 100 | 90 | 80 | 70 | 60 |
|---|---|---|---|---|---|
| Hole area at High Power | — | — | 985.7 | 937.8 | 883.3 |
| Hole area at Low Power | — | — | 940 | 889.6 | 822.7 |
| Hole area Range | — | — | 45.7 | 48.2 | 60.6 |

| Frame rate (%) | 50 | 40 | 30 | 20 | 10 | 0 |
|---|---|---|---|---|---|---|
| Hole area at High Power | 857.1 | 843.2 | 837.9 | 834.9 | 833.3 | 831.2 |
| Hole area at Low Power | 775.4 | 750.3 | 740.5 | 733.7 | 730.6 | 730.6 |
| Hole area Range | 81.7 | 82.9 | 97.4 | 101.2 | 102.7 | 100.6 |

In this respect, the framed mask of the present embodiment demonstrates excellent effect particularly when it is applied to the method for forming through holes that utilizes the reflected beam. However, the present invention is not necessarily limited to this method. The invention also demonstrates the aforesaid effect when applied to the usual laser processing which does not utilize the reflected beam.

Third Embodiment

Now, the description will be made of the example in which this method for forming through holes is applied to the formation of the discharge ports of an ink jet head.

The print quality of an ink jet printer depends greatly on the characteristics of ink discharged from the discharge ports serving as the openings from which ink is discharged, respectively. The ink discharging characteristics are determined substantially by the configuration and diameter of each discharge port. As a method for forming the discharge ports, there are roughly two methods. There have been proposed the electroforming that uses metallic plates or the formation that uses the electric discharge machining, and a method for processing a material, such as organic polymer resin, by sublimation (ablation) by the application of ultraviolet laser or higher energy laser which is typically represented by the excimer laser. At present, however, the fine processing method using the ultraviolet laser, is generally practiced. When the material, such as organic polymer resin, is processed by ablation using the ultraviolet laser with the energy concentration suitable for sublimate processing in accordance with the conventional technique, the processing area is gradually reduced from the incident side of the laser to the exit side thereof. The processed configuration becomes the so-called tapered shape. Here, the discharge port configuration, which is needed for the enhancement of the print quality of an ink jet head, is tapered to become narrower on the ink discharge side eventually. Therefore, the laser processing method should be arranged so that the laser is irradiated from the ink supply side (the ink flow path side of the discharge port plate) as disclosed in the specification of Japanese Patent Laid-Open Application No. 02-187346, for example.

However, in such a case of the laser processing, it has been known that the degree of the taper is caused to change depending on the applied laser powers. Also, since the length of the ink discharge port is required to be approximately 10 $\mu$m to 100 $\mu$m in consideration of the print quality. Naturally, the same thickness is required for the plate of the discharge ports accordingly. As a result, when the discharge ports are formed by the application of the method described above, the diameter of each discharge port on the ink discharge side (the exit side of laser) may be varied depending on each of the heads. Then, if the diameter of each discharge port should vary, there is a need for the head to provide the information to correct the discharge characteristics after having conducted the discharge inspections following the completion of each head particularly for the ink jet head which is provided with a plurality of discharge port groups or for the ink jet printer having a plurality of ink jet heads mounted on it.

In contrast, if the laser beam is irradiated from the ink discharge side, the diameter of each discharge port is scarcely influenced by the variation of the laser power. However, the configuration of each discharge port is inevitably in such a form that it becomes wider on the ink discharge side.

Now, therefore, if the laser processing that uses the reflected beam is applied to the formation of the discharge ports of an ink jet head, it becomes possible to form each discharge port in the tapered shape which becomes narrower toward the ink discharge side even if the laser beam is irradiated from the ink discharge side.

Figure 11A:
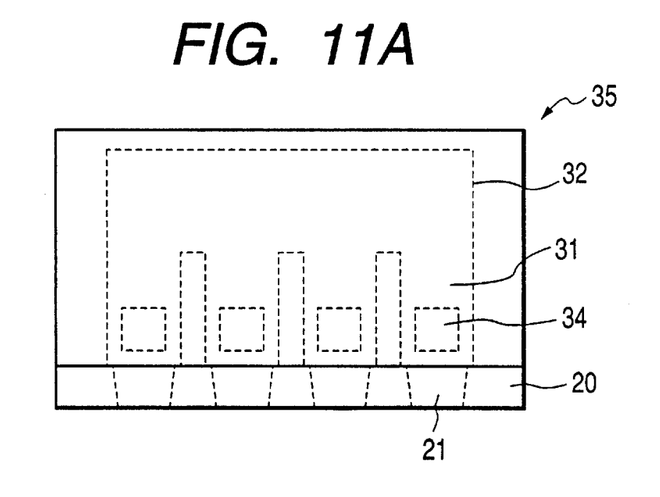
FIGS. 11A, 11B and 11C are schematic views which show an ink jet head in accordance with a third embodiment.
Figure 11B:
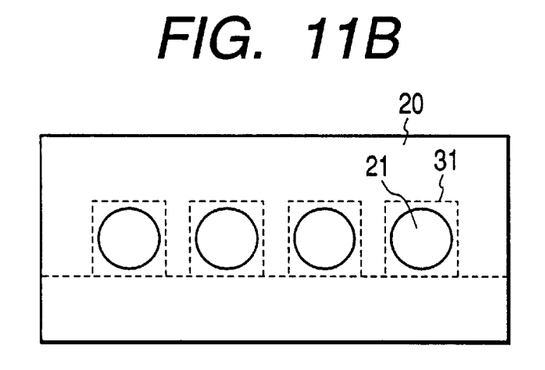
Figure 11C:
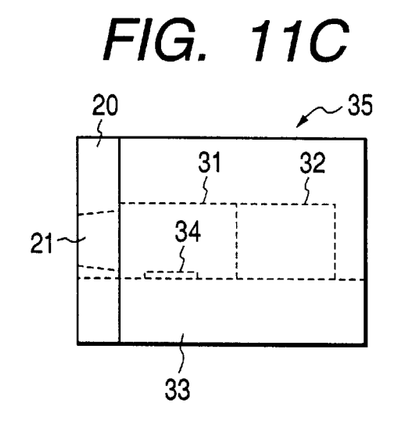

Here, FIGS. 11A to 11C are views which illustrate an ink jet head to which the aforesaid method for forming discharge ports is applied.

In FIGS. 11A to 11C, a reference numeral 33 designates a substrate. On this substrate, the ink discharge pressure generating elements 34, such as electrothermal converting elements, electro-mechanical converting elements, are arranged. The ink discharge pressure generating elements 34 are arranged in the ink flow paths 31 communicated with the discharge ports 21, respectively. Each of the ink flow paths 31 is communicated with the common liquid chamber 32. To the common liquid chamber 32, an ink supply tube (not shown) is connected to supply ink from the ink tank through this ink supply tube. Also, a reference numeral 35 designates the ceiling plate having the recessed portions that form the ink flow paths 31 and the common liquid chamber 32. When this ceiling plate is bonded to the substrate 33, the ink flow paths 31 and the common liquid chamber 32 are formed. Further, the discharge port plate 20 having the discharge ports 21 arranged therefor is provided on the end portion of the bonded body of the substrate 33 and the ceiling plate 35 on the ink flow path edge side. The ink jet head thus structured is produced in the following manner.

In other words, at first, the substrate 33 is produced by patterning the heaters 34, which are the heat generating resistive elements for use of generating the ink discharge pressure, and the integrated circuits, such as shift registers and others, as well as the electric wiring on the silicon substrate. At the same time, the ceiling plate 35 is produced by chemically etching the recessed portions that become the ink flow paths 31 and the ink liquid chamber 32, as well as the ink supply port, on the silicon plate. After that, the substrate 33 and the ceiling plate 35 are aligned so that the end face on the ink discharge port side and the arrangements of the ink flow paths 31 and the heaters 34 are in agreement with each other. Then, the discharge port plate 20 before the formation of the discharge ports is bonded to the edge face of the integrated body of the ceiling plate 35 and the substrate 33 on the ink discharge port side. Here, in this state, the discharge ports are formed by use of the laser processing equipment shown in FIG. 1 which irradiates excimer laser to the discharge port plate from the ink discharge side through the framed mask of the second embodiment hereof. After that, the electric board having the terminals for use of heat driving (not shown) is bonded, and at the same time, the aluminum base plate is bonded to the substrate 33. Then, the holder that supports each member and the ink tank to supply ink are coupled to assemble an ink jet head. The ink jet head thus obtained shows the configuration having the narrower leading end in the incident direction of the laser beam, and there are no flashes observed on each of opening configuration, either.

In this respect, it may be possible to make arrangement to align and bond the substrate 33 having the integrated circuit chip with the patterned heaters 34 with the structure having the ceiling plate provided with the grooves that become the ink flow paths 31, the recessed portion that becomes the ink chamber 32, and the ink supply port, as well as the discharge port plate 200 before the discharge ports are integrally formed on polysulfone or some other resin by injection molding, and then, to form the discharge ports 21 by use of the discharge port processing method described above. After that, the electric board having the terminals for use of heat driving (not shown) is bonded, and at the same time, the aluminum base plate is bonded to the substrate 33. Subsequently, the holder that supports each member and the ink tank to supply ink are coupled to assemble an ink jet head.

Here, irrespective of the structure of an ink jet head, the discharge port processing of the present invention should preferably be performed in the processing step after the step in which the discharge port plate for which discharge ports yet to be processed is bonded to the member (head main body) that supports this plate. With an ink jet head thus manufactured, it becomes possible to prevent the discharge ports from being distorted in its arrangement along with the deformation of the discharge port plate that may take place when it is bonded to its supporting member or to prevent the discharge ports from being deformed so as not to allow the arrangement direction of each discharge port to become irregular, which may otherwise result in the positional variation of the ink thus discharged.

What is claimed is:

1. A method for forming a through hole having laser beam as a light source to project said laser beam to the work object using an optical system through a photomask for the formation of a through hole on said work object by ablation processing, comprising the following steps of:

increasing the concentration of the optical processing energy contributing to the process using the reflected beam created from said work object in the laser ablation processing; and forming the through hole having the configuration enabling the narrower end to be changed to the wider end in the incident direction of laser beam.

2. A method for forming a through hole according to claim 1, wherein the depth of said through hole is made as desired by cutting said work object in the thickness direction of said work object from the incident direction side of the laser beam subsequent to said laser irradiation step.

3. A method for forming through holes according to claim 2, wherein the thickness of said work object is secured by bonding the same kind of material to said work object on the incident direction side of the laser beam, and said bonded material is peeled off after said laser beam irradiation step.

4. A method for forming a through hole according to either one of claim 1 to claim 3, wherein said through hole is the one arranged on an insulating layer portion and filled with a conductive substance to connect electrically the conductive layers themselves of a substrate having said conductive layers above and below through the insulating layer.

5. A method for forming through holes according to claim 1, wherein said laser beam is excimer laser beam.

6. A method for forming a through hole according to claim 1, wherein said photomask comprises a light shielding portion to form the unexposed portion in the interior of the through hole formed on the work object, and a light transmitting portion surrounding said light shielding portion to form each of said through hole.

7. A method for forming through holes according to claim 6, wherein the reflected beam from said work object created in said laser ablation processing is the reflected beam from the unprocessed portion by the optical processing, and resides inside the processing configuration.

8. A method for forming a through hole according to claim 6, wherein the ratio between the outer diameter of said light transmitting portion and the outer diameter of said light shielding portion of said mask is 30% or more and 80% or less.

9. A method for forming through holes according to claim 6, wherein given the distance between said light transmitting portion and light shielding portion as WT, the thickness of said work object is $d>4.76 \cdot K \cdot WT$ (where the K is the contraction magnification of the optical system, and the WT is the distance between the light transmitting portion and light shielding portion of the mask).

10. A method for forming through holes according to claim 1, wherein said thorough hole is a discharge port of an ink jet head.

11. A method for forming a through hole according to claim 10, wherein said laser beam is irradiated from the ink discharge side of said ink discharge port.

12. A method for forming a through hole according to claim 11, wherein the irradiation of said laser beam is performed in the state of said work object being bonded to the main body of an ink jet head.

13. A method for forming a through hole on a work object using a laser beam as a light source, said method comprising the steps of:

projecting the laser beam onto the work object through a photomask using an optical system, and forming a through hole in the work object by ablation processing, wherein the photomask comprises a light shielding portion to form the unexposed portion in the interior of the through hole formed on the work object, and a light transmitting portion surrounding the light shielding portion to form each of the through holes.

14. A method for forming a through hole according to claim 13, wherein said through hole is a discharge port of an ink jet head.

15. A method according to claim 13, wherein a reflected beam reflected from the work object created in said ablation processing is the reflected beam from the unprocessed portion by the optical processing, and resides inside the processing configuration.

16. A method according to claim 13, wherein the ratio between the outer diameter of said light transmitting portion and the outer diameter of said light shielding portion of said mask is 30% or more and 80% or less.

17. A method according to claim 13, wherein the thickness d of the work object is $d>4.76 \cdot K \cdot WT$, where K is the contraction magnification of the optical system and WT is the distance between the light transmitting portion and the light shielding portion of the photomask.

* * * * *

UNITED STATES PATENT AND TRADEMARK OFFICE
CERTIFICATE OF CORRECTION

PATENT NO. : 6,423,934 B2  Page 1 of 1
DATED : July 23, 2002
INVENTOR(S) : Toshinori Hasegawa et al.

It is certified that error appears in the above-identified patent and that said Letters Patent is hereby corrected as shown below:

Column 3,
Line 4, "inner" should read -- at the inner --.

Column 5,
Line 7, "angel" should read -- angle --.

Column 6,
Line 49, "more" should read -- motor --.

Column 9,
Line 16, "tape" should read -- taper --; and
Line 54, "of the" should be deleted.

Column 12,
Line 8, "ration" should read -- ratio --; and
Line 12, "porion" should read -- portion --.

Column 13,
Line 19, "since" should be deleted.

Column 15,
Line 32, "each of said" should read -- the --.

Column 16,
Line 5, "thorough" should read -- through --.

Signed and Sealed this

Eighteenth Day of February, 2003

JAMES E. ROGAN
*Director of the United States Patent and Trademark Office*